(12) United States Patent
Scanlan et al.

(10) Patent No.: US 6,677,246 B2
(45) Date of Patent: Jan. 13, 2004

(54) ENDPOINT DETECTION IN THE ETCHING OF DIELECTRIC LAYERS

(75) Inventors: John Scanlan, Waterford (IE); Michael B. Hopkins, Dublin (IE)

(73) Assignee: Scientific Systems Research Ltd., Dublin (IE)

( * ) Notice: Subject to any disclaimer, the term of this patent is extended or adjusted under 35 U.S.C. 154(b) by 63 days.

(21) Appl. No.: 10/021,324

(22) Filed: Dec. 6, 2001

(65) Prior Publication Data
US 2002/0048960 A1 Apr. 25, 2002

(30) Foreign Application Priority Data
Mar. 23, 2001 (IE) .......................................... 2001/0288

(51) Int. Cl.[7] .......................................... H01L 21/302
(52) U.S. Cl. .......................................... 438/723; 438/10
(58) Field of Search .......................... 438/9, 10, 706, 438/710, 714, 723; 216/59, 60, 61, 63, 67

(56) References Cited

U.S. PATENT DOCUMENTS

| | | | | |
|---|---|---|---|---|
| 4,954,212 A | * | 9/1990 | Gabriel et al. | 216/61 |
| 5,198,072 A | | 3/1993 | Gabriel | |
| 5,489,361 A | * | 2/1996 | Barbee et al. | 438/8 |
| 5,501,766 A | | 3/1996 | Barbee et al. | |
| 5,582,746 A | * | 12/1996 | Barbee et al. | 216/86 |
| 5,653,894 A | * | 8/1997 | Ibbotson et al. | 216/59 |
| 6,068,783 A | * | 5/2000 | Szetsen | 216/60 |
| 6,326,794 B1 | | 12/2001 | Lundquist et al. | |

FOREIGN PATENT DOCUMENTS

EP 0455455 11/1991

* cited by examiner

Primary Examiner—Kin-Chan Chen
(74) Attorney, Agent, or Firm—Thomas M. Freiburger

(57) ABSTRACT

In a method of manufacturing a miniature multilayer device 10 a low open area dielectric layer 18 is selectively etched through to an underlying conductive region 16 using an electrically conducting medium such as a plasma 24. The endpoint of the etch process is determined by detecting the abrupt change in capacitance across the device 10 just as the final portion of the dielectric layer is removed.

9 Claims, 7 Drawing Sheets

ENDPOINT DETECTION IN THE ETCHING OF DIELECTRIC LAYERS

BACKGROUND OF THE INVENTION

1. Field of the Invention

The present invention relates to the etching of dielectric layers in miniature multilayer devices, such as semiconductor integrated circuits (ICs), and particularly to endpoint detection of low open area dielectric etch processes.

2. Prior Art

The manufacture of miniature devices such as ICs and other micro-electronic devices formed on a substrate uses etching of dielectric material during many of the manufacturing process steps. An example of one very important step is selective plasma etching of dielectric layers. Typically, the dielectric is silicon dioxide and it is used as an insulating layer in the device structure. In order to complete the IC structure, many layers must be deposited and etched sequentially to integrate the semi-conducting, conducting and insulating layers which comprise the IC. Among the dielectric etch processes, formation of the device contacts, called "contact etch", and formation of the vias by which the metal conducting lines are connected, called "via etch", are critical to the device functionality and integrity.

An important aspect of all semiconductor plasma etch processes is determining when sufficient material has been etched and stopping the process prior to inadvertently removing layers below and destroying the device. For example, during contact etch, it is essential that the etch process be terminated at the silicon contact. Over-etching would remove portions of the active silicon, even if the oxide etch chemistry is highly selective to oxide over silicon, and would be detrimental to the IC operation. Similarly, via etching must stop on top of the underlying metal layer to maintain device integrity. Over-etching is also costly as the over-etch can be a significant part of the process time leading to wasteful consumption of gases and machine time.

IC geometries are continually decreasing in size to facilitate higher processing speeds and greater memory capacity of the devices. This means that contact and via holes sizes are getting smaller relative to the area of the wafer as device packing densities increase. The area of exposed oxide to be etched over the total substrate area is known in the art as the "open-area". As device geometries shrink, the open-area of these etch processes is decreasing, resulting in increased difficulties in determining etch process endpoint.

The sensitivity of any endpoint technique can be defined as the change in measured signal divided by the variance of that signal during the plasma process. It is known in the art as the signal-to-noise ratio for the endpoint signal. This ratio determines the ultimate effectiveness of any endpoint detector. As open areas decrease, it is found that this signal-to-noise ratio also decreases, since the chemical or physical event which defines endpoint occurs over a much smaller area ratio. There is a need therefore for an endpoint system which facilitates endpoint detection in dielectric etch processes that can be extended to very low open areas.

The plasma etch process usually involves placing a silicon wafer substrate coated with various conducting and insulating layers in a process chamber, introducing process gases and applying radio-frequency power to create the plasma. The plasma consists then of ions, electrons, radical gas species and neutral gas, all of which permit the desired reaction to proceed.

The current state of the art relies on the endpoint of the process to be determined from a change in the process gas composition due to breakthrough into the layer below the layer being etched. The uncovered layer normally contains a different mixture of chemical compounds than the etched layer. The presence of chemicals released from the uncovered layer in the plasma process gas can be determined by various methods, based on a change in the impedance of the plasma, the optical light output of the plasma, or position of the match unit: see, for example, U.S. Pat. Nos. 4,207,137; 4,493,745; 4,615,761 and 4,954,212. However, as the open area is reduced and in certain types of etch process such as oxide etch, very small amounts of chemicals are released, and the changes to the plasma are no longer easily detected.

A typical commercial endpoint detector in plasma etch systems is based on optical emission from the plasma. The optical sensor is generally set up to monitor light at a particular frequency, or frequencies, associated with etching a specific layer. For example, when etching silicon dioxide through to metal, such as in via etch applications, the optical sensor system may be set up to monitor emissions from both the oxide material and the metal as both are excited by the plasma species. Observation in how these emissions change as the oxide is removed and the metal is exposed facilitates the technique. There is substantial prior art on this technique and recent advances include multiple wavelength observations with signal processing to enhance signal-to-noise as far as possible. However, the ultimate sensitivity of the technique remains limited by the fact that as open-area decreases, the intensity of optical emissions for given species decreases (proportionally and linearly) and can therefore be so low as to be lost in the noise of the system.

There is a need therefore, for a method which overcomes or mitigates the limitations of present endpoint detection schemes, especially on low open area dielectric etch processes.

SUMMARY OF THE INVENTION

According to the present invention there is provided a method of manufacturing a miniature multilayer device in which a low open area dielectric layer is selectively etched through to an underlying conductive region using an electrically conducting medium, wherein the endpoint of the etch process is determined by detecting the abrupt change in capacitance across the device just as the final portion of the dielectric layer is removed.

Preferably the electrically conducting medium is a plasma.

BRIEF DESCRIPTION OF THE DRAWINGS

An embodiment of the invention will now be described, by way of example, with reference to the accompanying drawings, wherein.

DETAILED DESCRIPTION OF A PREFERRED EMBODIMENT

Figure 1:
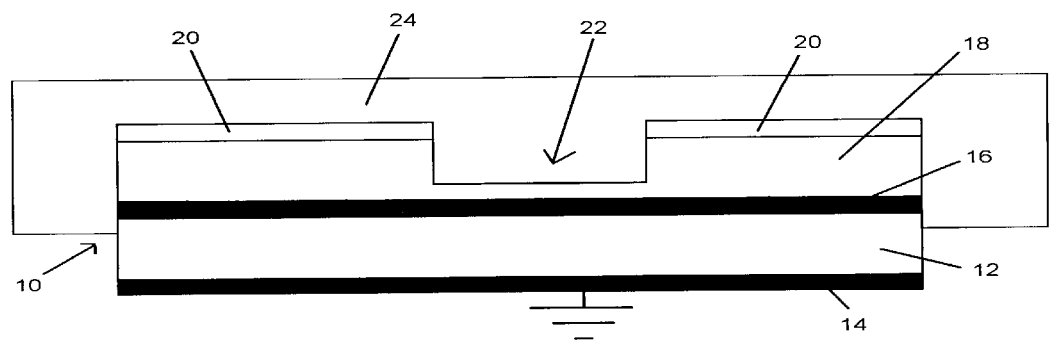
FIG. 1 is a simplified diagram of a via hole being etched in an oxide layer on a dielectric wafer by a conducting medium.

Referring now to FIG. 1, a simplified multilayer wafer 10 includes a dielectric (e.g. silicon dioxide) substrate 12 having electrically conductive (e.g. metal) layers 14, 16 respectively on its top and bottom surfaces, and a further silicon oxide layer 18 on the metal layer 16. The oxide layer 18 is selectively covered with an etch-resistant photo-resist mask 20 (or alternatively a hard mask) and the wafer is shown undergoing etching of a via hole 22 by an RF (radio frequency) plasma 24. The open area of the etch process 10 is about 25%.

The total capacitance of the wafer is given by:

$$Ct = 1/[1/(Cl+Ce) + 1/Cs]$$

where Cl is the capacitance of the layer 18 excluding the part remaining in the via hole 22, Ce is the capacitance of the part of the layer 18 in the via hole 22, and Cs is the capacitance of the substrate 12.

Figure 2:
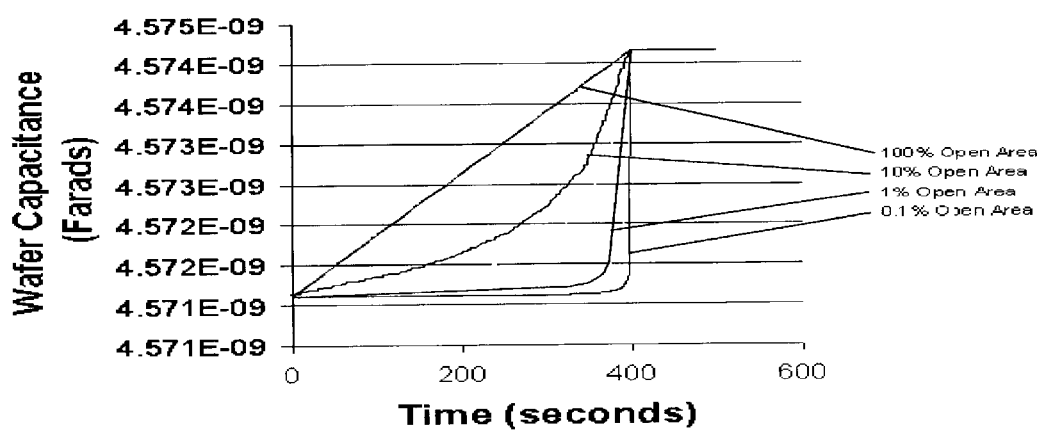
FIG. 2 illustrates the change in capacitance of the wafer of FIG. 1 as the dielectric layer is removed.

FIG. 2 shows the change in capacitance of the wafer as a function of open area for a typical oxide etch application, with open areas in the range 0.1% to 100%. The etch rate is 150 nm per minute, the oxide layer is 1000 nm thick, and the wafer is 0.75 mm thick. In the case of the 100% open area the capacitance changes slowly as the layer is etched. However, the maximum rate of change of capacitance increases as the open area is reduced. An abrupt transition in capacitance is seen in the lowest open area examples (1% and, especially, 0.1%), and this is independent of the removed layer chemistry—it is a physical event due to the disappearance of the capacitive dielectric layer in the hole causing the capacitance of the dielectric layer to be shunted by the conducting etch medium. This phenomenon, which is called etch layer shunting (ELS) herein, occurs just as the final portion of the layer 18 is removed in the via hole 22 and provides an opportunity to measure endpoint. The time derivative of the ELS signal increases with reduced open area, in contrast to current endpoint techniques.

In current etch applications it is not convenient to measure the capacitance of the wafer directly during the etch process. However, the rapid change in capacitance of the wafer immersed in the conductive plasma can be measured indirectly. Processing plasmas are generally excited by radio-frequency (RF) power. The plasma represents a non-linear complex load in electrical terms. This results in the generation of harmonics of the RF driving signal. These harmonics, known as Fourier components, are very sensitive to changes both in the plasma process.

When etching an oxide layer an RF sensor suitably positioned can measure the voltage, current and phase of the RF drive signal, which are correlated to the impedance of the plasma as well as the impedance of the substrate. The RF sensor measures waveforms, which are correlated with changes in all these impedance compounded. The impedance of the substrate further consists of the impedance of the substrate (e.g. silicon wafer) as well as the impedance of any layers thereon. In the case of etch endpoint where the plasma or process does not change (as confirmed by optical or other methods) then the RF sensor can be used to detect the change in voltage, current and phase associated with the abrupt change in wafer capacitance at endpoint. It is important that a technique with a very high resolution such as that described in U.S. Pat. No. 6,061,006 is available to detect the small signal.

Figure 3:
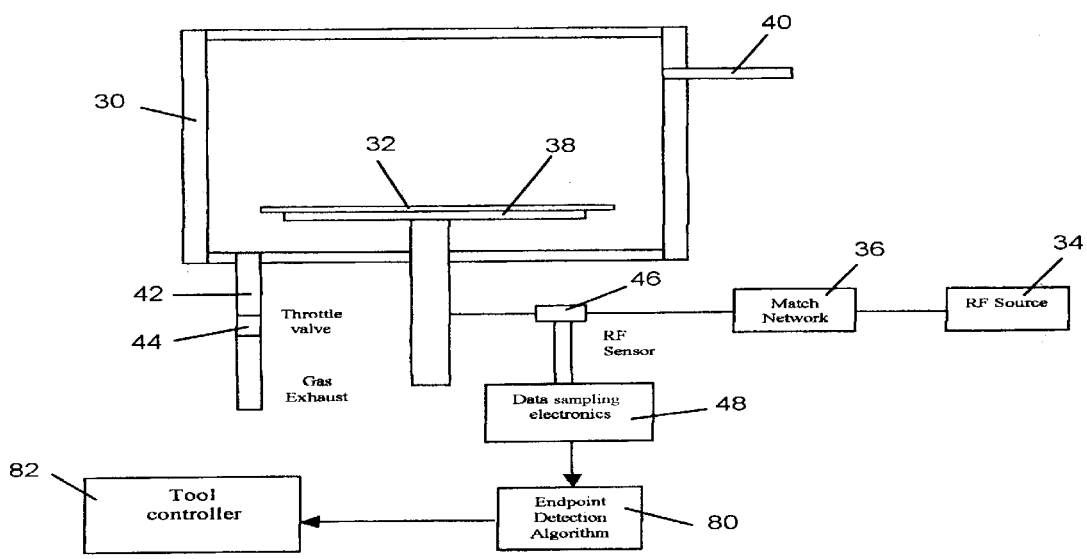
FIG. 3 is a schematic diagram of an apparatus for performing an embodiment of the invention.

FIG. 3 shows a typical plasma process reactor which may be used to perform the invention. A plasma chamber 30 is used to process a wafer/substrate 32. The plasma is powered by an RF source 34. This source generally has real impedance which must undergo a transformation to match that of the complex plasma load. This is done via match network 36. Power is coupled to the plasma chamber through an electrode 38. Process gases are admitted through a gas inlet 40 and the chamber is maintained at a desirable pressure by pumping through a gas exhaust line 42. A throttle valve 44 may be used to control pressure.

Figure 4:
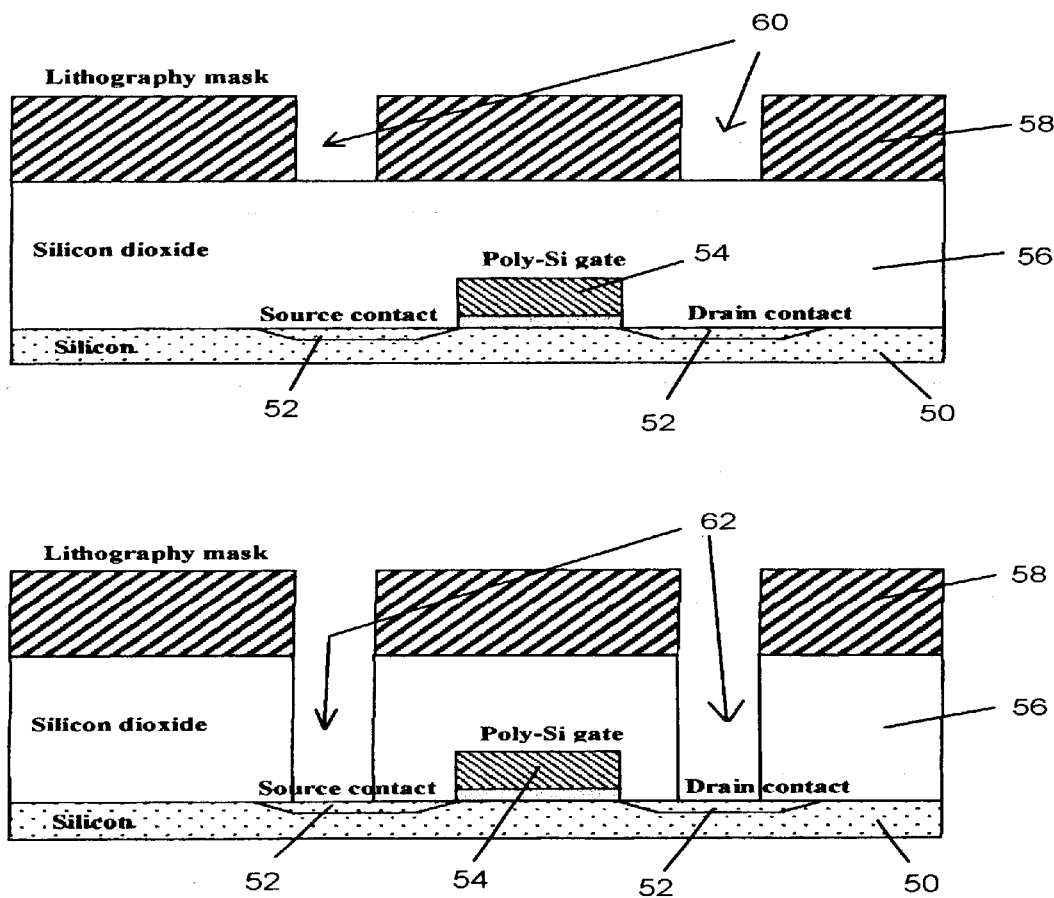
FIG. 4 shows a semiconductor oxide etch process of a contact hole.

FIG. 4 shows a typical semiconductor wafer 32 having contact holes which may be etched using the apparatus of FIG. 3 and whose endpoint may be determined using the present invention. The upper drawing in FIG. 4 shows the wafer prior to etching the contact holes and the lower drawing after the etching is complete. It will be understood that FIG. 4 shows only a part of a much larger area wafer.

The wafer comprises a silicon substrate 50 having highly doped regions 52 constituting conductive source and drain contacts for an FET having a polysilicon gate structure 54. A layer of silicon dioxide 56 overlies the substrate 50 and a photolithographic etch mask 58 is formed on the oxide layer 56. The mask 58 has openings 60 corresponding to the ultimate contact holes 62.

Figure 5:
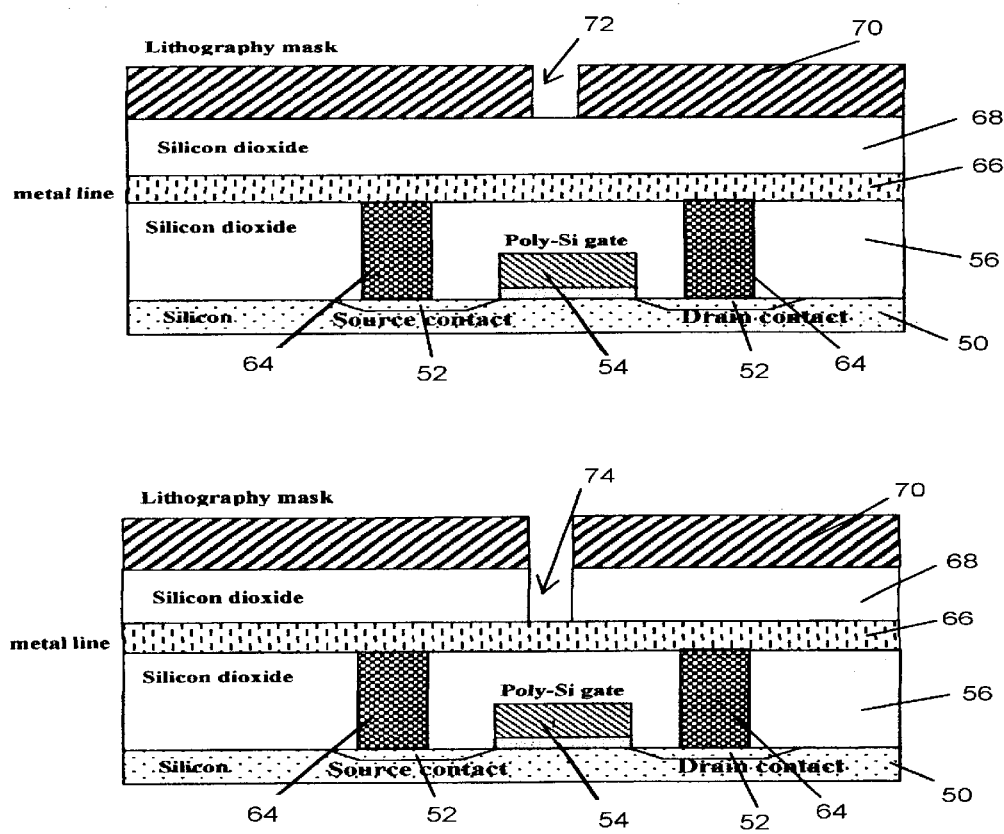
FIG. 5 shows a semiconductor oxide etch process of an inter-metal layer via hole.

FIG. 5 shows the etching of a via hole in the same wafer at a later stage in processing. The upper drawing in FIG. 5 shows the wafer prior to etching the via holes and the lower drawing after the etching is complete.

The mask 58 has been removed, the contact holes 62 filled with metal 64 and a metal line 66 formed on the oxide layer 56, all by conventional techniques. A further layer of silicon dioxide 68 is deposited on the layer 56 and metal line 66, and a further photolithographic etch mask 70 is formed on the oxide layer 68. The mask 70 has openings 60 corresponding to the ultimate via hole 74.

In order to determine the endpoint of etching holes such as the contact holes 62 and the via hole 74, an RF sensor 46 is used to measure the voltage and current of the electrical power signal in the complex post-match electrical line. A data sampling instrument 48 uses a sampling technique to perform a Fourier Transform on the RF sensor signal, which extracts the Fourier components of the voltage and current and the phase angle between these vectors. This data sampling instrument 48 should have sufficiently high resolution to determine Fourier components (typically five) across a very large dynamic range (90 dB) with very high phase resolution of up to 0.001 degree. A suitable RF sensor and sampling technique are described in U.S. Pat. Nos. 5,808,415 and 6,061,006.

Figure 6:
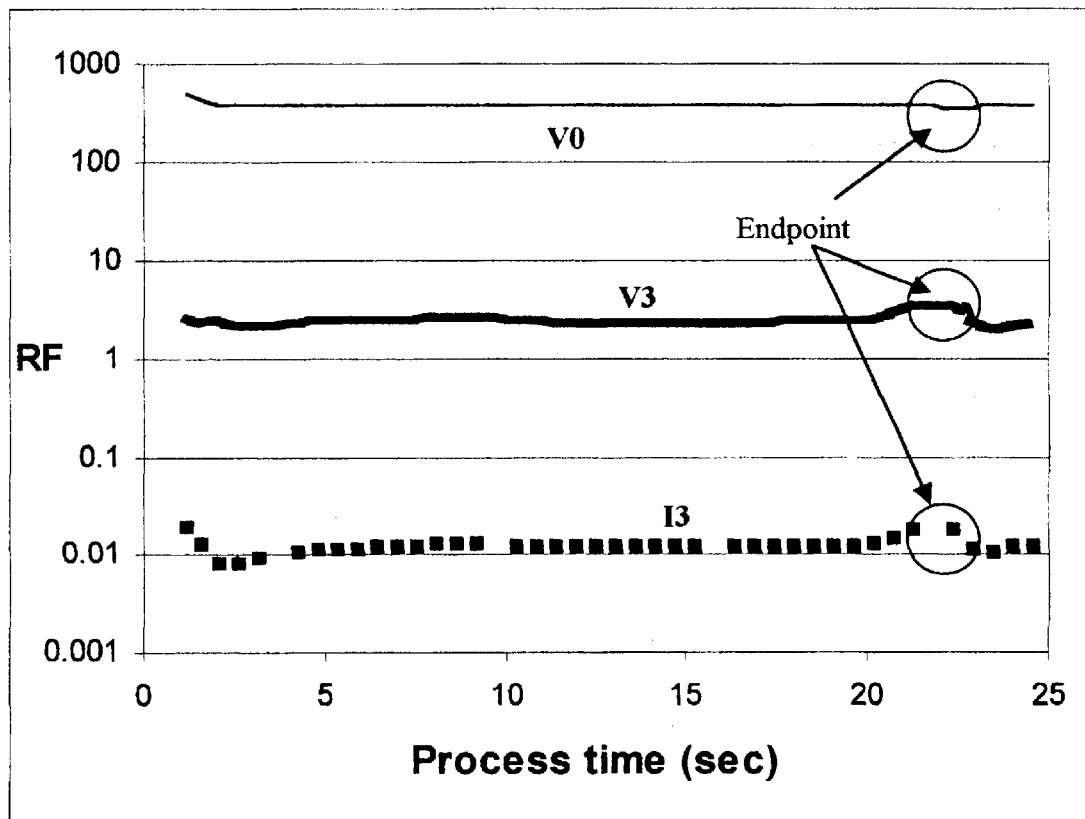
FIG. 6 shows endpoint data for a 1% open area contact structure.
Figure 7:
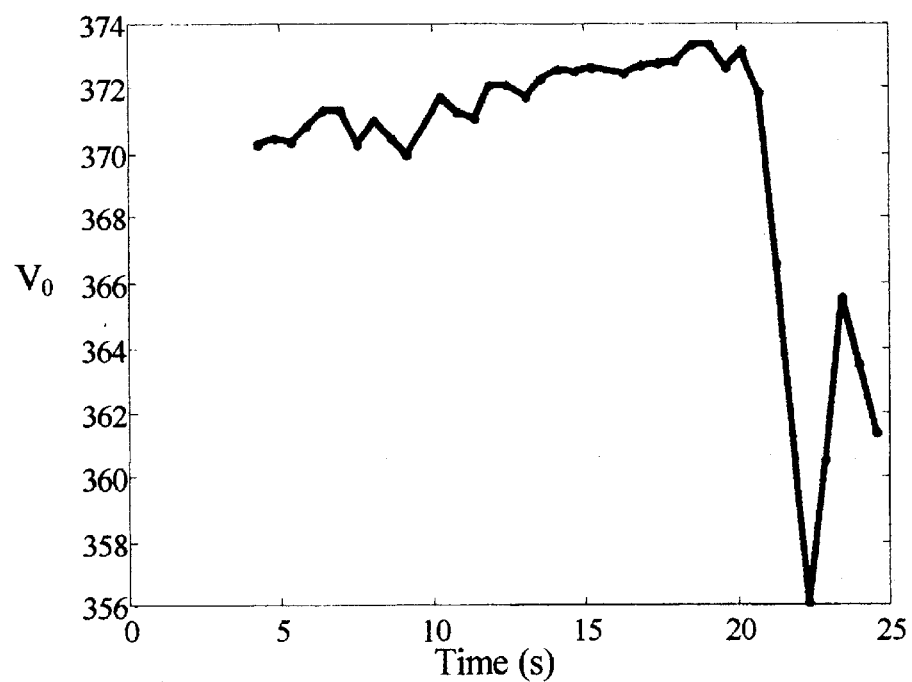
FIG. 7 shows an expanded view of the endpoint data from a 1% open area contact structure for fundamental voltage and third harmonic voltage.
Figure 7:
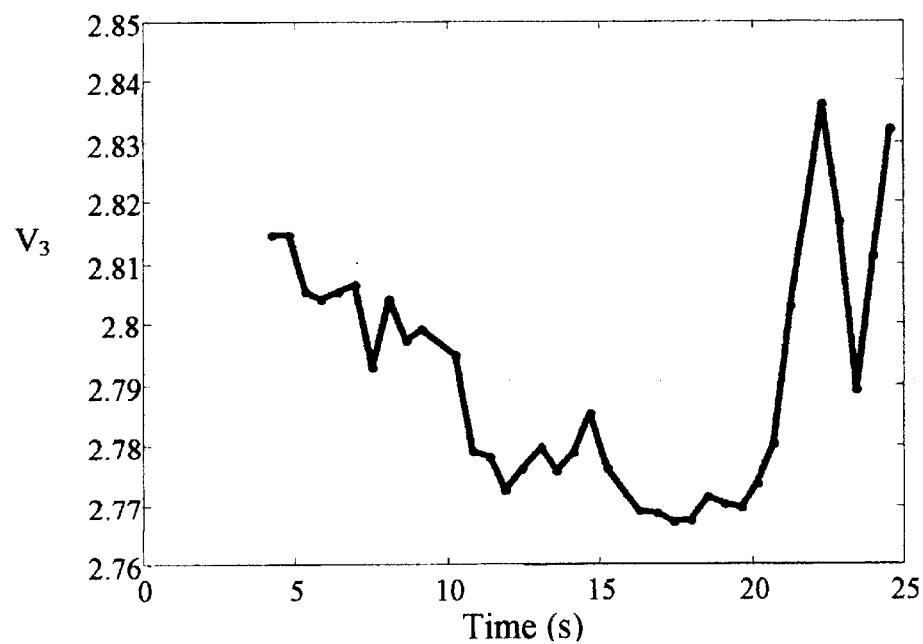

The data in FIG. 6 shows the first and third harmonics of voltage and the third harmonic of current thus determined from a 1% open area structure in an inter-metal layer via etch process measured with the apparatus of FIG. 3. The endpoint of the process is seen as a very small change in the basic parameters associated with the rapid change in wafer capacitance. FIG. 7 shows the same endpoint data from a 1% open area contact for fundamental voltage and third harmonic voltage on an expanded vertical scale. These signals are above the background noise and are reproducible. It would be possible to ascertain the endpoint directly from these signals using a suitable endpoint detection algorithm 80 since the steep rise or fall of the relevant voltage component is readily identifiable.

Figure 8:
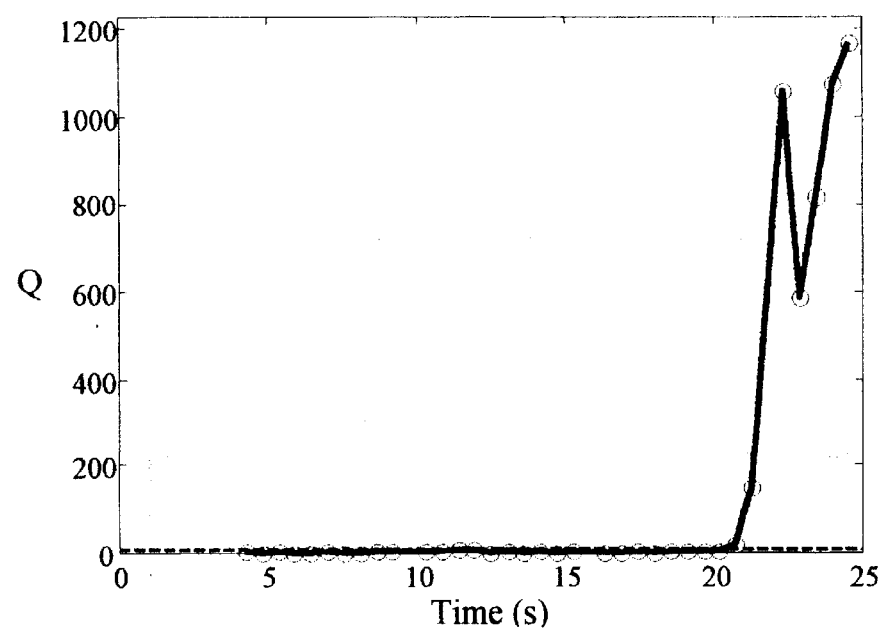
FIG. 8 shows Q and $T^2$ statistic multivariate enhancement of RF data at endpoint for a 1% open area contact.
Figure 8:
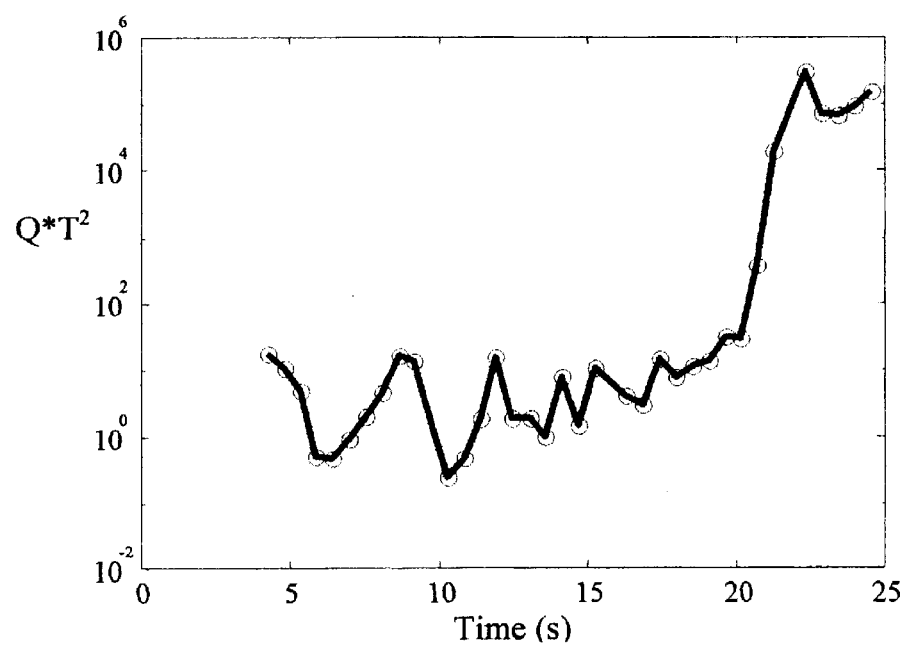

However, by combining voltage and current and phase from the fundamental and four higher harmonics and using a standard multivariate analysis package to extract the Q and $T^2$ statistics a significant enhancement of RF data at endpoint on 1% open area contact can be achieved, as shown in FIG. 8. A signal to noise ratio of close to two orders of magnitude can be achieved, so that the endpoint even more readily and reproducibly detectable by the algorithm 80.

Upon detection of the endpoint, a signal is sent to a tool controller 82, which controls the overall operation of the plasma chamber, to remove the RF power and hence stop the etch process.

A particular advantage of the present invention is that the abrupt change in capacitance which is detected in fact commences shortly (the period depending on the open area) before the etch process is complete, see FIG. 2. Since it may take several seconds for etching to stop when the plasma is turned off, it is possible to turn off the plasma at an optimum time, so that etching more accurately ceases at the exact point at which the last part of the dielectric material in the contact or via hole is etched. This contrasts with the prior art which monitors changes in the plasma itself to detect the endpoint. Since such changes occur only when the underlying conductive material is exposed, turning off the plasma at that point will lead to a small degree of over-etching.

An alternative approach to detecting the abrupt change in capacitance caused by ELS would be to monitor the DC bias which develops across the wafer, which will change when the endpoint is reached and can be monitored. Alternatively, a low frequency signal could be used to monitor the capacitance of the wafer. An experienced engineer can devise many other methods for in-situ monitoring of the parameters that will vary in proportion to the wafer capacitance.

Although the foregoing has described a method of determining the endpoint of the etch process where the wafer has an open area of 1%, the process is applicable in general where the open area is low, most preferably about 5% or less.

The invention is not limited to the embodiments described herein which may be modified or varied without departing from the scope of the invention.

What is claimed is:

1. A method of manufacturing a miniature multilayer device in which a low open area dielectric layer is selectively etched through to an underlying conductive region using an electrically conductive medium such that during said etching the partially etched and non-etched areas represent parallel capacitors, wherein the endpoint of the etch process is determined by detecting the abrupt change in total capacitance across the device just as the final portion of the dielectric layer is removed.

2. A method as claimed in claim 1, wherein the open area is less than 5%.

3. A method as claimed in claim 1 or 2, wherein the conducting medium is a plasma.

4. A method as claimed in claim 3, wherein the plasma is generated by an RF source, and the change in capacitance is detected by analyzing the characteristics of the drive signal applied to the plasma.

5. A method as claimed in claim 4, wherein the change in capacitance is detected by analysing at least one harmonic of the drive signal.

6. A method as claimed in claim 5, wherein the harmonic is analysed using multivariate analysis.

7. A method as claimed in claim 1, wherein the device is a semiconductor integrated circuit.

8. A method as claimed in claim 7, wherein the open area comprises at least one via hole in the dielectric layer.

9. A method as claimed in claim 7, wherein the open area comprises at least one device contact hole in the dielectric layer.

* * * * *